(12) United States Patent
Fowler et al.

(10) Patent No.: US 11,930,613 B2
(45) Date of Patent: Mar. 12, 2024

(54) ELECTRONIC ASSEMBLY WITH GLIDE SURFACES AND RELATED METHODS

(71) Applicant: EAGLE TECHNOLOGY, LLC, Melbourne, FL (US)

(72) Inventors: Clarke O. Fowler, Merritt Island, FL (US); Lawrence Ludwig, III, Melbourne, FL (US)

(73) Assignee: EAGLE TECHNOLOGY, LLC, Melbourne, FL (US)

( * ) Notice: Subject to any disclaimer, the term of this patent is extended or adjusted under 35 U.S.C. 154(b) by 0 days.

(21) Appl. No.: 17/804,112

(22) Filed: May 26, 2022

(65) Prior Publication Data

US 2023/0389218 A1 Nov. 30, 2023

(51) Int. Cl.
*H05K 7/20* (2006.01)
*H05K 7/18* (2006.01)

(52) U.S. Cl.
CPC .......... *H05K 7/18* (2013.01); *H05K 7/20009* (2013.01)

(58) Field of Classification Search
CPC ............................. H05K 7/18; H05K 7/20009
See application file for complete search history.

(56) References Cited

U.S. PATENT DOCUMENTS

| | | | |
|---|---|---|---|
| 4,375,290 A | 3/1983 | Zucchi et al. | |
| 5,424,916 A * | 6/1995 | Martin | H05K 7/20636 361/698 |
| 7,324,336 B2 | 1/2008 | Vos et al. | |
| 7,995,346 B2 * | 8/2011 | Biemer | H05K 7/20563 361/752 |
| 9,999,156 B2 | 6/2018 | Holahan et al. | |
| 10,791,652 B2 | 9/2020 | Thompson et al. | |
| 2009/0225510 A1 | 9/2009 | Biemer et al. | |
| 2015/0208554 A1 | 7/2015 | Leigh et al. | |
| 2016/0278241 A1 | 9/2016 | Kaplun et al. | |
| 2019/0380225 A1 | 12/2019 | Thompson et al. | |
| 2021/0410330 A1 | 12/2021 | Thompson et al. | |

OTHER PUBLICATIONS

"VITA—Standards Updates" https://www.vita.com/StandardsUpdates; pp. 5. retreived from internet May 3, 2022.
U.S. Appl. No. 17/660,842, filed Apr. 27, 2022 Nguyen et al.
U.S. Appl. No. 17/660,838, filed Apr. 27, 2022 Nguyen et al.

* cited by examiner

*Primary Examiner* — Mukundbhai G Patel
(74) *Attorney, Agent, or Firm* — ALLEN, DYER, DOPPELT, GILCHRIST, P.A. Attorneys at Law

(57) ABSTRACT

An electronic assembly includes a chassis having electronic module mounting positions. The electronic assembly also includes a respective electronic module received in each electronic module mounting position and having a module cooling gas passageway. Each electronic module has a module glide surface. The electronic assembly includes a respective sealing retainer coupled between the chassis and each electronic module. The sealing retainer has a cooling gas passageway aligned with a chassis cooling gas passageway and the module cooling gas passageway. The sealing retainer includes a retainer body having a retainer glide surface, and a gas sealing gasket carried by the retainer body. The module glide surface and the retainer glide surface have respective cooperating features so that the respective electronic module is maintained in spaced relation from the sealing gasket as the respective electronic module is slidably inserted into a seated position.

21 Claims, 14 Drawing Sheets

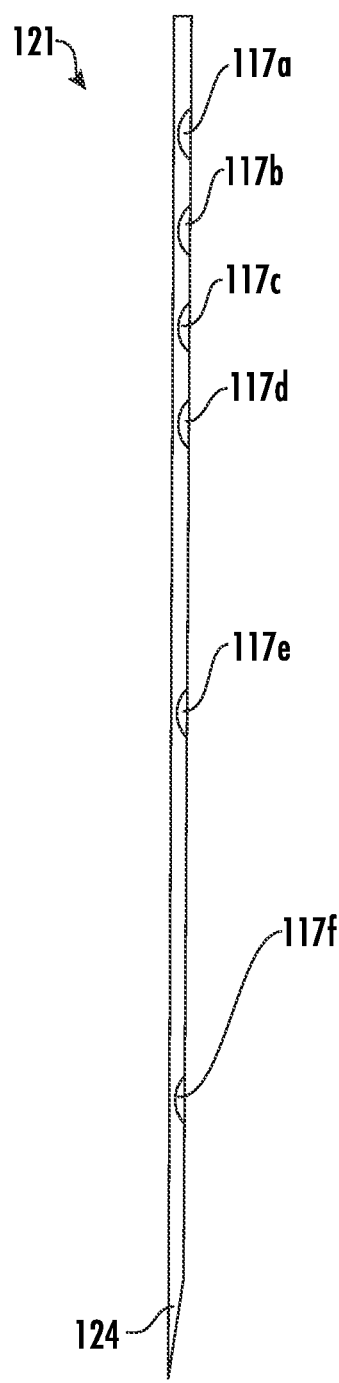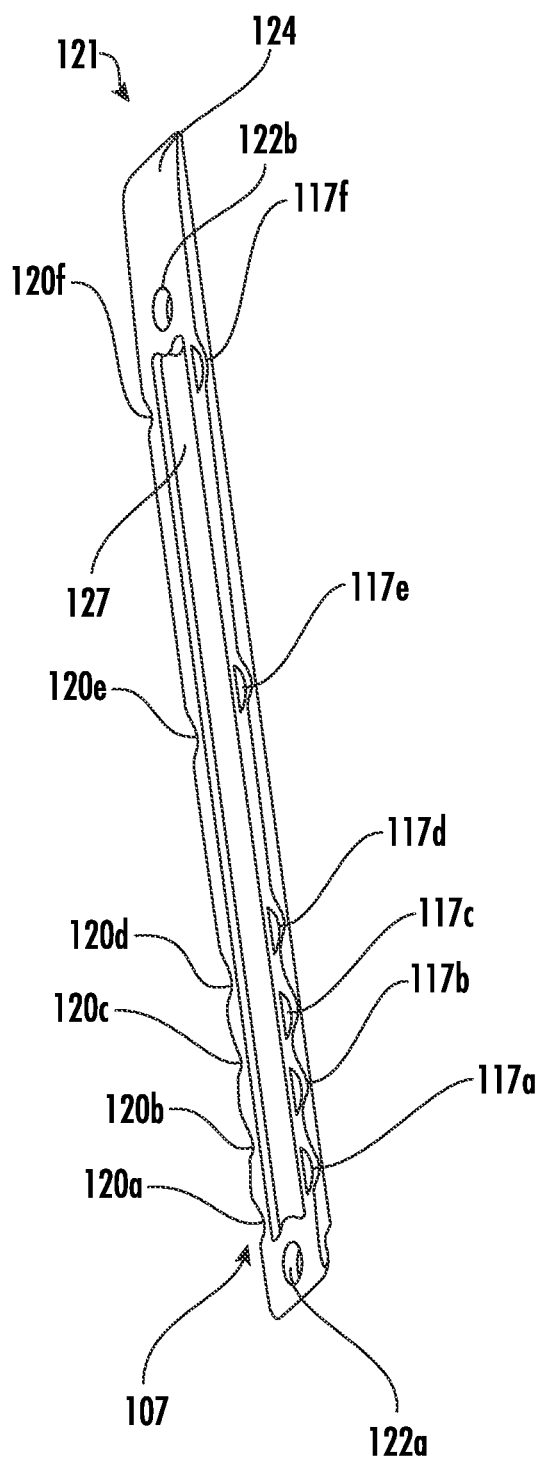
FIG. 5A
FIG. 5B

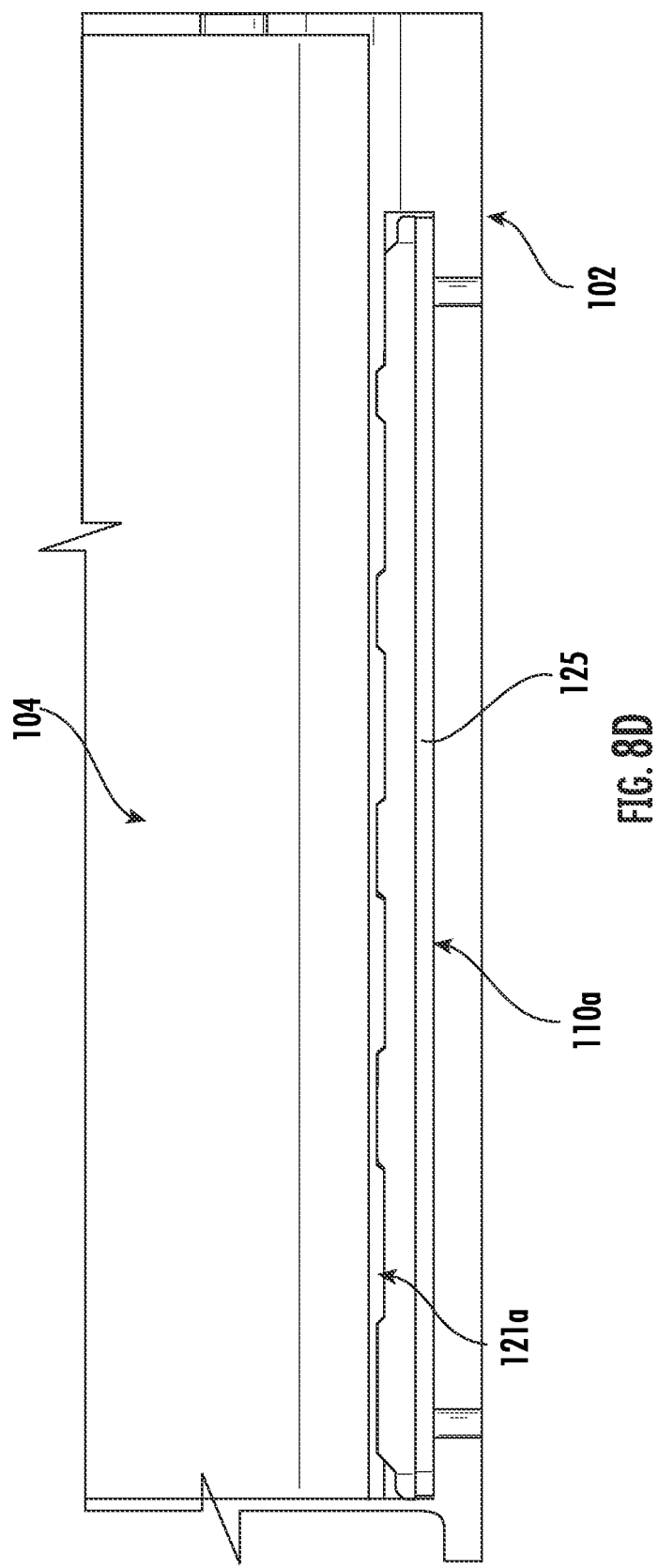

ELECTRONIC ASSEMBLY WITH GLIDE SURFACES AND RELATED METHODS

TECHNICAL FIELD

The present disclosure relates to the field of electronics, and, more particularly, to electronic assemblies that receive electronic modules and related methods.

BACKGROUND

As electronic packaging density and dissipated power increase to achieve higher levels of electronic performance, the need for efficient thermal transport within electronic assemblies having electronic modules carrying printed circuit boards also increases. Even though electronic components are becoming smaller with greater processing capability, and operate at a much lower power, these two advantages may have a counterintuitive effect of increasing thermal density because circuit designers are expected to pack even more functionality into ever smaller circuit spaces, thus increasing heat generation and requiring more advanced cooling and thermal management.

Brute force heat transfer techniques may involve forced air, active liquid cooling, and similar heat transport mechanisms to transport heat from sensitive electronic components to heat sinks or similar heat spreading devices. Some heat transfer systems even use composite structures, for example, annealed pyrolytic graphite (APG) embedded within metallic skins or heat pipes connected to spreader plates.

A new industry standard, however, encourages the increased use of convection cooling to reduce dependence on conduction cooling using 3U and 6U circuit cards. The ANSI/VITA 48.8 mechanical form-factor standard leverages air-flow-through (AFT) cooling for chassis architectures to provide increased thermal performance while mitigating risk to electronic modules carrying different electronic components. The gas, normally air, is isolated to cooling paths adjacent the circuit board and the electronic components, where there are no foreign object debris (FOD), contaminants, or impingements to the airflow.

The VITA 48.8 AFT standard is directed to channeling airflow through plug-in module heat sinks that interface with a pressurized airflow manifold to reduce thermal resistances between the cooling medium and the heat-generating electronic components and provide a common framework for original equipment manufacturer (OEM) chassis and electronic module manufacturers. Designs that implement the VITA 48.8 AFT technology, however, may have technical drawbacks because of the complexity required in providing precision tapers on the plug-in electronic modules and the requirements for gaskets that interface components that cause binding. The gaskets may be compromised during insertion and extraction of the electronic modules.

SUMMARY

Generally, an electronic assembly comprises a chassis having a plurality of electronic module mounting positions. Each electronic module mounting position has a chassis cooling gas passageway. The electronic assembly also comprises a respective electronic module received in each electronic module mounting position and having a module cooling gas passageway. Each electronic module has a module glide surface. The electronic assembly further comprises a respective sealing retainer coupled between the chassis and each electronic module. The sealing retainer has a cooling gas passageway therethrough aligned with the chassis cooling gas passageway and the module cooling gas passageway. The sealing retainer comprises a retainer body having a retainer glide surface, and a gas sealing gasket carried by the retainer body. The module glide surface and the retainer glide surface have respective cooperating features so that the respective electronic module is maintained in spaced relation from the sealing gasket as the respective electronic module is slidably inserted into a seated position.

In particular, in some embodiments, one of the module glide surface and the retainer glide surface may comprise a plurality of protrusions, and the other of the module glide surface and the retainer glide surface may comprise a plurality of valleys. The plurality of valleys may be aligned with the plurality of protrusions when the respective electronic module is in the seated position. The plurality of valleys may be offset from the plurality of protrusions when the respective electronic module is not in the seated position. In some embodiments, each of the plurality of protrusions may comprise a roller device on an uppermost portion thereof.

Also, the module glide surface may comprise a tapered distal end. The sealing retainer may comprise a biasing member coupled between the retainer body and a respective electronic module mounting position. The sealing retainer may comprise a shoulder screw carried by the respective electronic module mounting position and extending through the retainer body. The chassis cooling gas passageway may comprise one of a chassis cooling gas inlet passageway and a chassis cooling gas outlet passageway. The electronic assembly may also comprise at least one cooling gas manifold coupled to the chassis. Each electronic module may comprise at least one circuit board having a cooling gas path associated therewith. Moreover, each electronic module may comprise a plurality of wedge lock style retainers adjacent the module glide surface, and a plurality of extraction levers for coupling to the electronic module mounting position.

Another aspect is directed to a method for mounting an electronic module in an electronic module mounting position of a chassis. Each electronic module mounting position has a chassis cooling gas passageway. The electronic module has a module cooling gas passageway, and a module glide surface. The method comprises coupling a sealing retainer between the chassis and the electronic module. The sealing retainer has a cooling gas passageway therethrough aligned with the chassis cooling gas passageway and the module cooling gas passageway. The sealing retainer comprises a retainer body having a retainer glide surface, and a gas sealing gasket carried by the retainer body. The module glide surface and the retainer glide surface have respective cooperating features so that the respective electronic module is maintained in spaced relation from the sealing gasket as the respective electronic module is slidably inserted into a seated position.

BRIEF DESCRIPTION OF THE DRAWINGS

FIG. 5A is a schematic side view of a glide surface body from the electronic module of FIG. 1.

FIG. 5B is a schematic perspective view of the glide surface body from the electronic module of FIG. 1.

FIGS. 8A-8D are schematic side views of the electronic module being slidably inserted into the seated position of the electronic assembly of FIG. 1.

DETAILED DESCRIPTION

The present disclosure will now be described more fully hereinafter with reference to the accompanying drawings, in which several embodiments of the invention are shown. This present disclosure may, however, be embodied in many different forms and should not be construed as limited to the embodiments set forth herein. Rather, these embodiments are provided so that this disclosure will be thorough and complete, and will fully convey the scope of the present disclosure to those skilled in the art. Like numbers refer to like elements throughout.

The VITA 48.8 AFT standard may not be widely adopted in the industry, and most designs may include shearing of seals when the electronic modules are inserted. Because of this, the existing approaches may not operate reliably since the damaged seals create openings/leaks in the cooling system. Moreover, the existing approach is wide, which creates SWaP issues.

Figure 1:
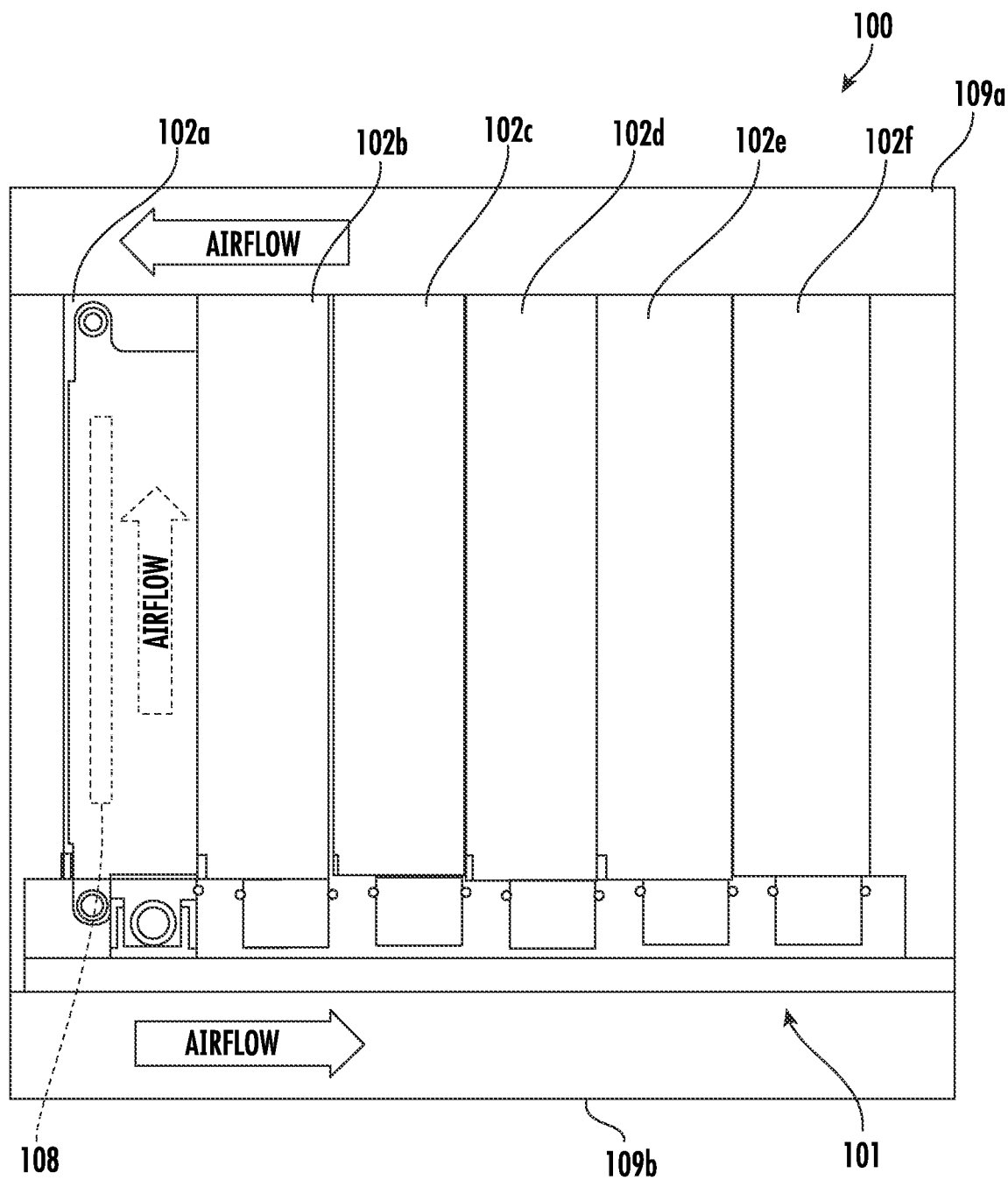
FIG. 1 is a schematic front view of an electronic assembly with a single electronic module positioned therein, according to the present disclosure.
Figure 2:
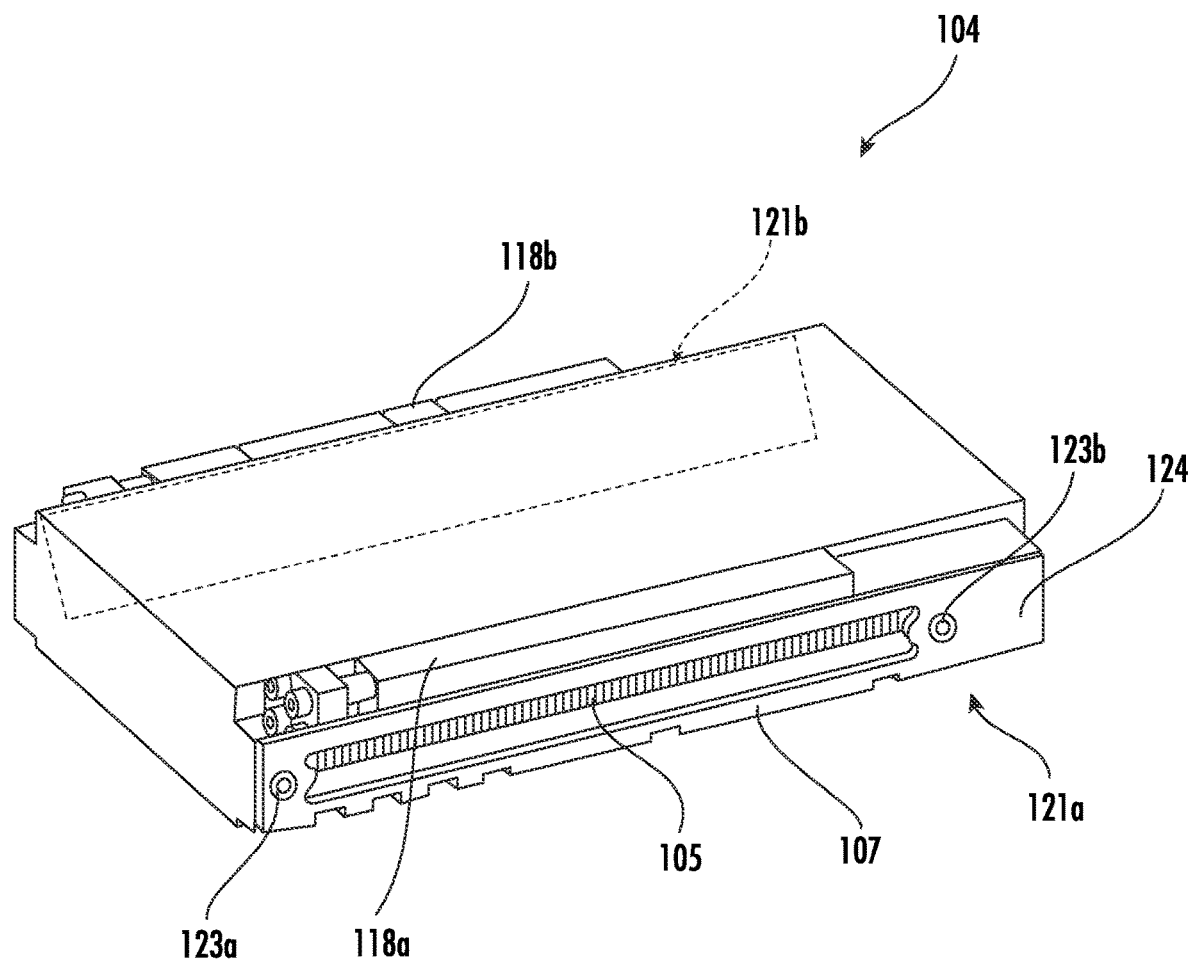
FIG. 2 is a schematic perspective view of the electronic module of FIG. 1.
Figure 3:
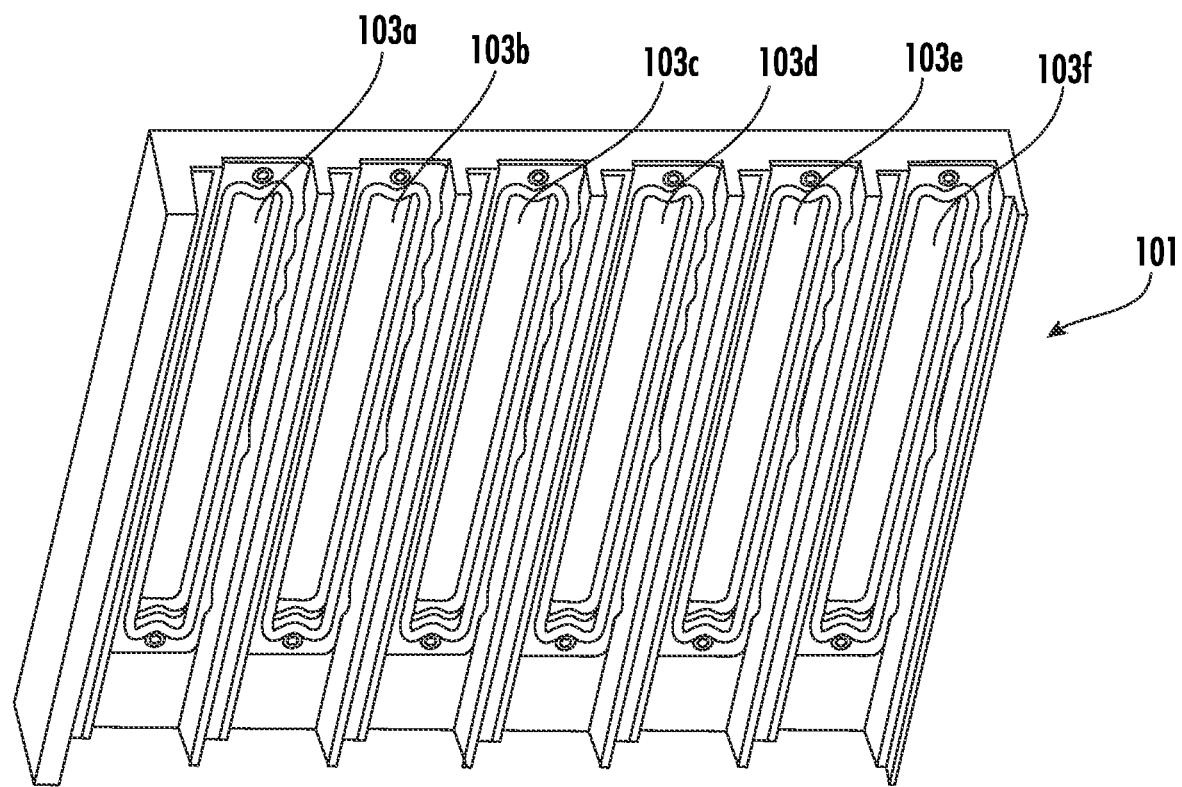
FIG. 3 is a schematic perspective view of a portion of a chassis from the electronic assembly diagram of FIG. 1.

Referring initially to FIGS. 1-6, an electronic assembly 100 according to the present disclosure is now described. The electronic assembly 100 includes a chassis 101 having a plurality of electronic module mounting positions 102*a*-102*f*. Each electronic module mounting position 102*a*-102*f* has opposing first and second chassis cooling gas passageways 103*a*-103*f*. As will be appreciated, only the first chassis cooling gas passageways 103*a*-103*f* are shown in FIG. 3, but it should be appreciated that the second chassis cooling gas passageways are similarly constituted. Each chassis cooling gas passageway 103*a*-103*f* comprises one of a chassis cooling gas inlet passageway and a chassis cooling gas outlet passageway.

Figure 4:
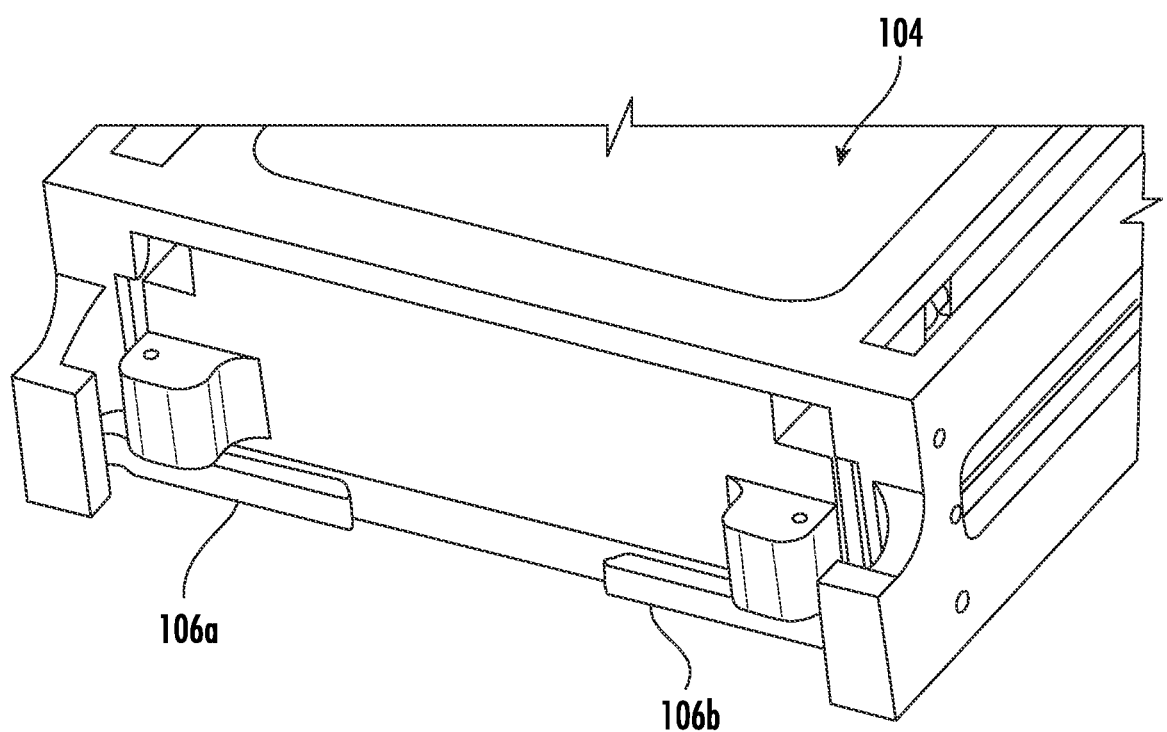
FIG. 4 is a schematic perspective view of the electronic module of FIG. 1 inserted into the chassis with wedge lock style retainers.

The electronic assembly 100 also comprises a respective electronic module 104 received in each electronic module mounting position 102*a*-102*f* and having a module cooling gas passageway 105. For illustrative clarity, only one electronic module 104 is depicted. As shown in FIG. 4, the respective electronic module 104 illustratively includes installation and extraction levers 106*a*-106*b* for assisting in overcoming the required seating forces and installing the electronic module to the proper depth when in a seated position. As shown in FIG. 2, the module 104 illustratively includes wedge lock style retainers 118*a* and 118*b* for keeping the module 104 in the seated position. Each electronic module 104 comprises a circuit board 108 having a cooling gas path associated therewith, the cooling gas path extending between respective first and second chassis cooling gas passageways 103*a*-103*f*. For illustrative clarity, only one circuit board 108 is shown, but it should be appreciated that the electronic module may comprise a plurality of circuit boards. For example, the circuit board 108 may comprise an OpenVPX 3U circuit board format or an OpenVPX 6U circuit board format. Although not depicted for drawing clarity, the electronic assembly 100 includes a backplane circuit board receiving the respective circuit boards 108.

The electronic assembly 100 comprises first and second cooling gas manifolds 109*a*-109*b* coupled to the chassis 101. As will be appreciated, the first and second cooling gas manifolds 109*a*-109*b* respectively provide cool air into the chassis cooling gas inlet passageway, and receive warm air from the chassis cooling gas outlet passageway.

As perhaps best seen in FIG. 2, each electronic module 104 has a module glide surface 107. The electronic assembly 100 further comprises respective sealing retainers 110*a*-110*b* coupled between the chassis 101 and each electronic module 104. The sealing retainer 110*a*-110*b* has a cooling gas passageway 111 therethrough aligned with the chassis cooling gas passageway 103*a*-103*f* and the module cooling gas passageway 105.

The sealing retainer 110*a*-110*b* comprises a retainer body 112 having a retainer glide surface 113, and a gas sealing gasket 114 carried by the retainer body. The gas sealing gasket 114 surrounds the cooling gas passageway 111 and ensures a tight seal (e.g. air tight or hermetic seal) for fluidly coupling to the first and second cooling gas manifolds 109*a*-109*b*. For example, the gas sealing gasket 114 may comprise a flexible material, such as rubber.

In this illustrated embodiment, the retainer glide surface 113 comprises a plurality of protrusions 115*a*-115*f*, 116*a*-116*f*, and the module glide surface 107 comprises a plurality of valleys 117*a*-117*f*, 120*a*-120*f*. It should be appreciated that the arrangement of the plurality of protrusions 115*a*-115*f*, 116*a*-116*f* and the plurality of valleys 117*a*-117*f*, 120*a*-120*f* may be reversed on the retainer glide surface 113 and the module glide surface 107.

Figure 7A:
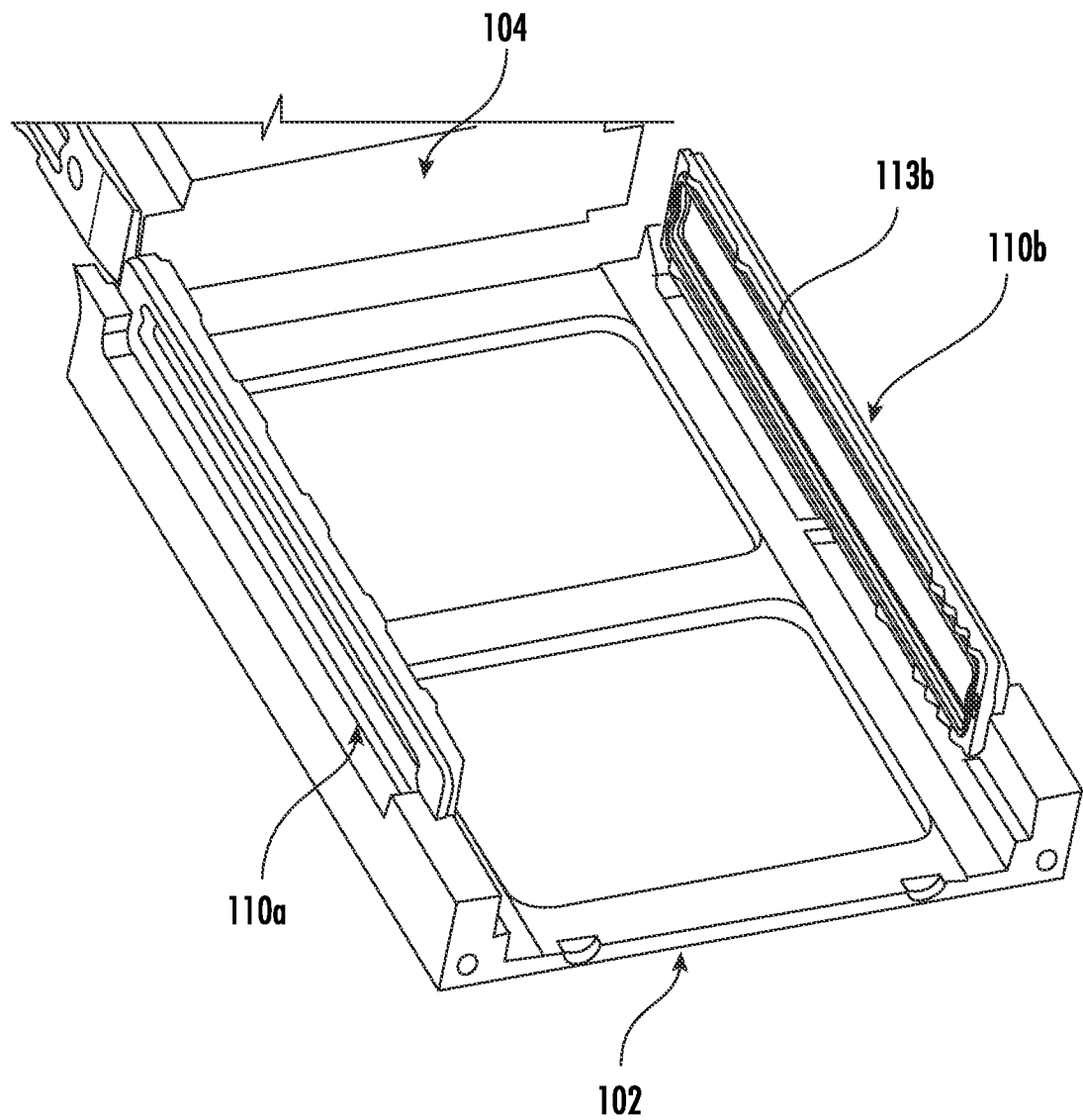
FIGS. 7A-7C are schematic perspective views of the electronic module being slidably inserted into a seated position of the electronic assembly of FIG. 1.
Figure 7B:
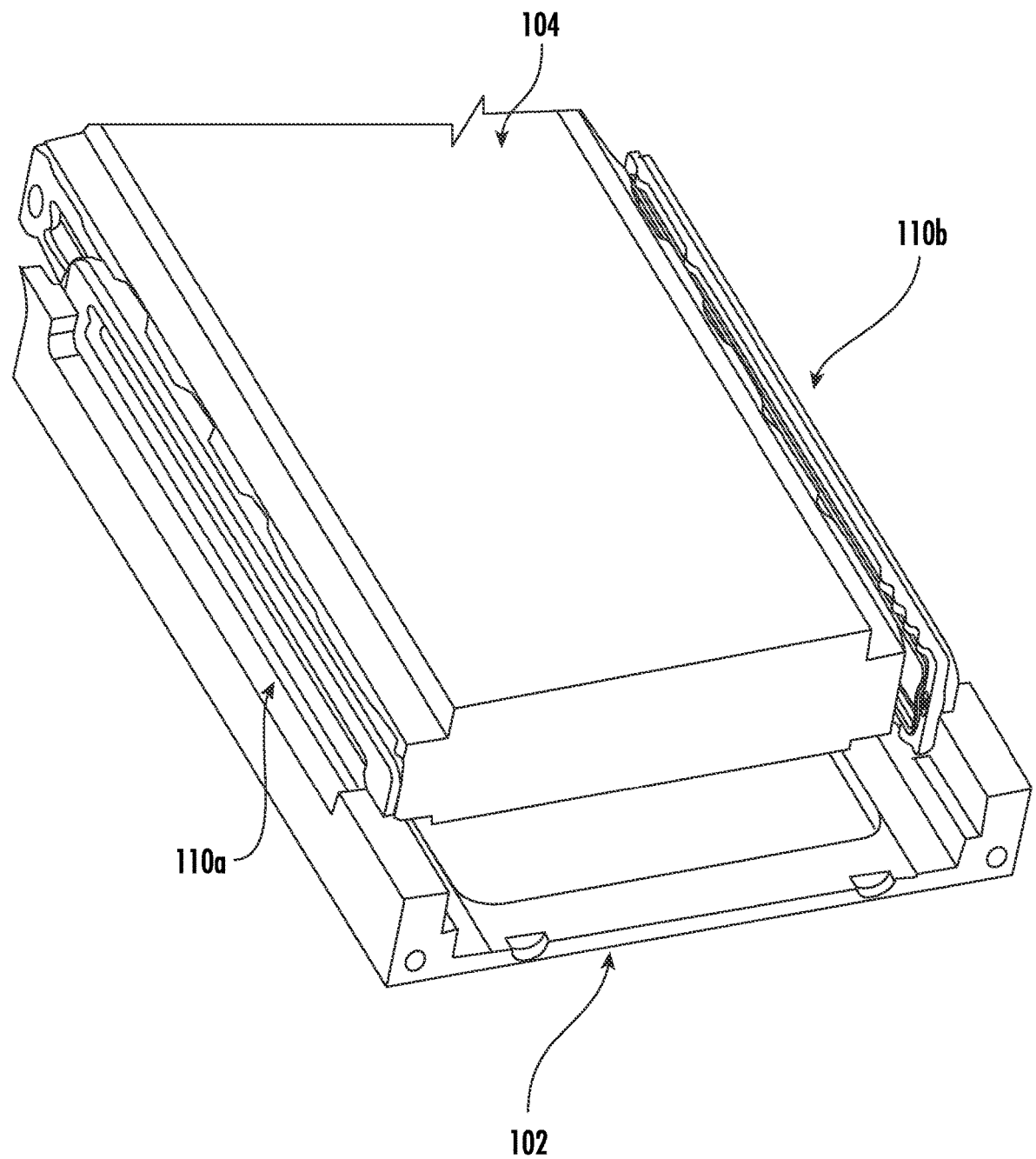
Figure 7C:
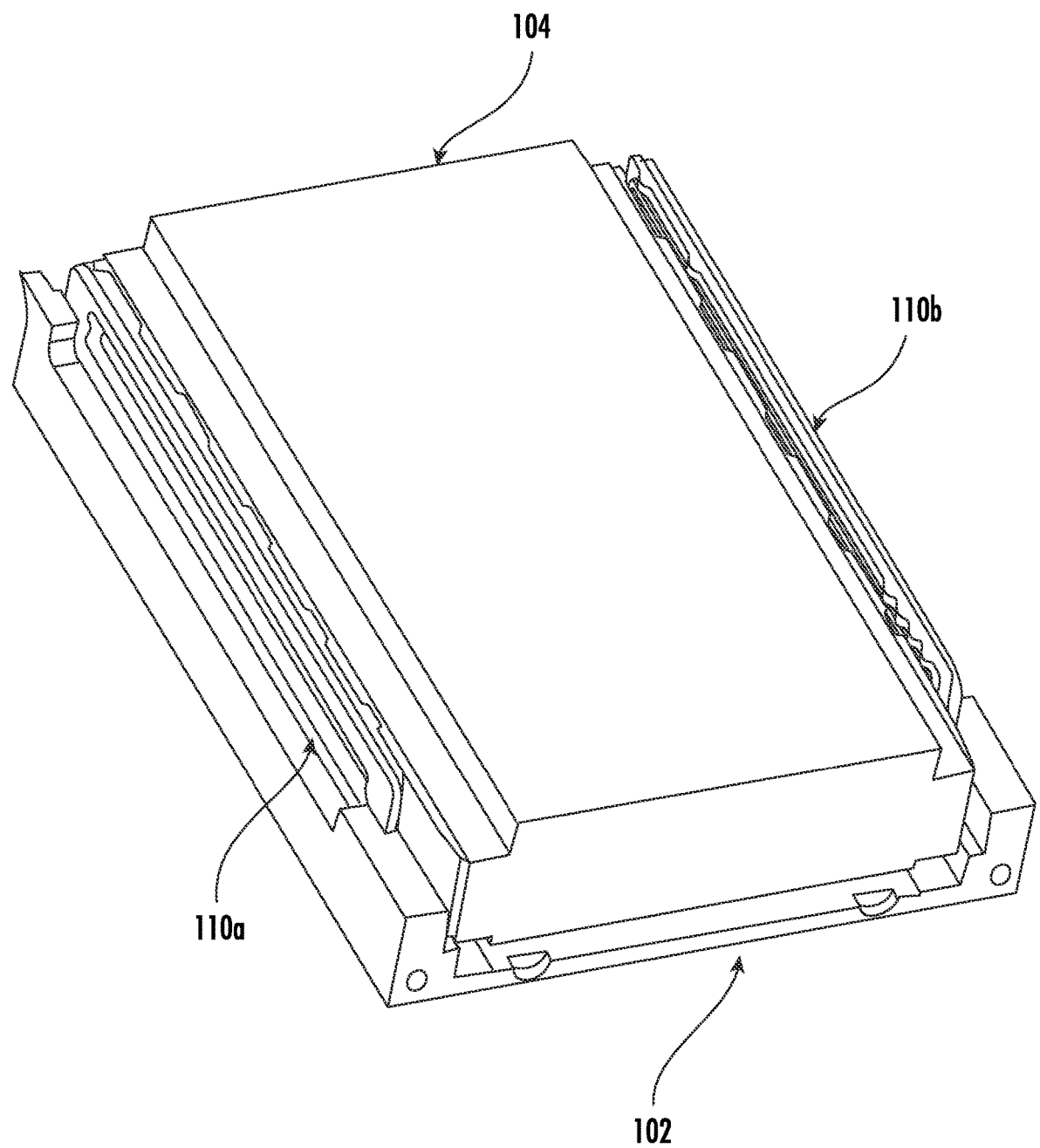
Figure 8A:
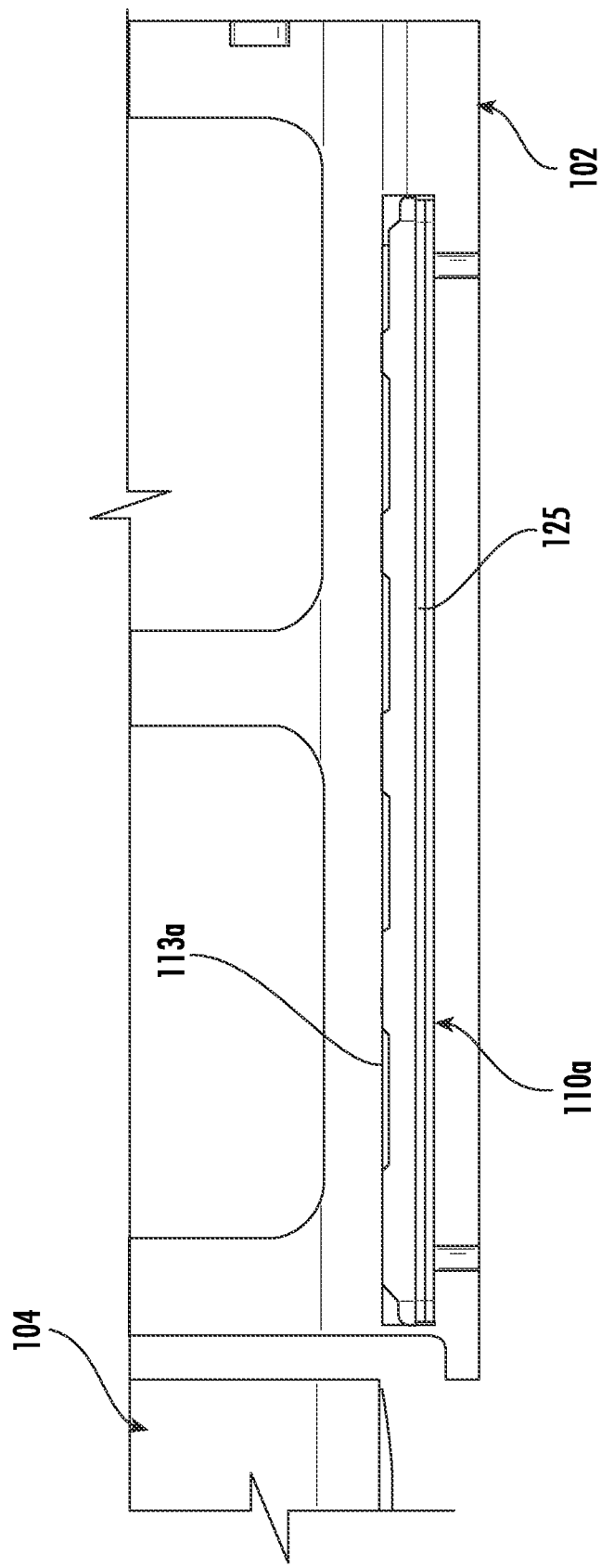
Figure 8B:
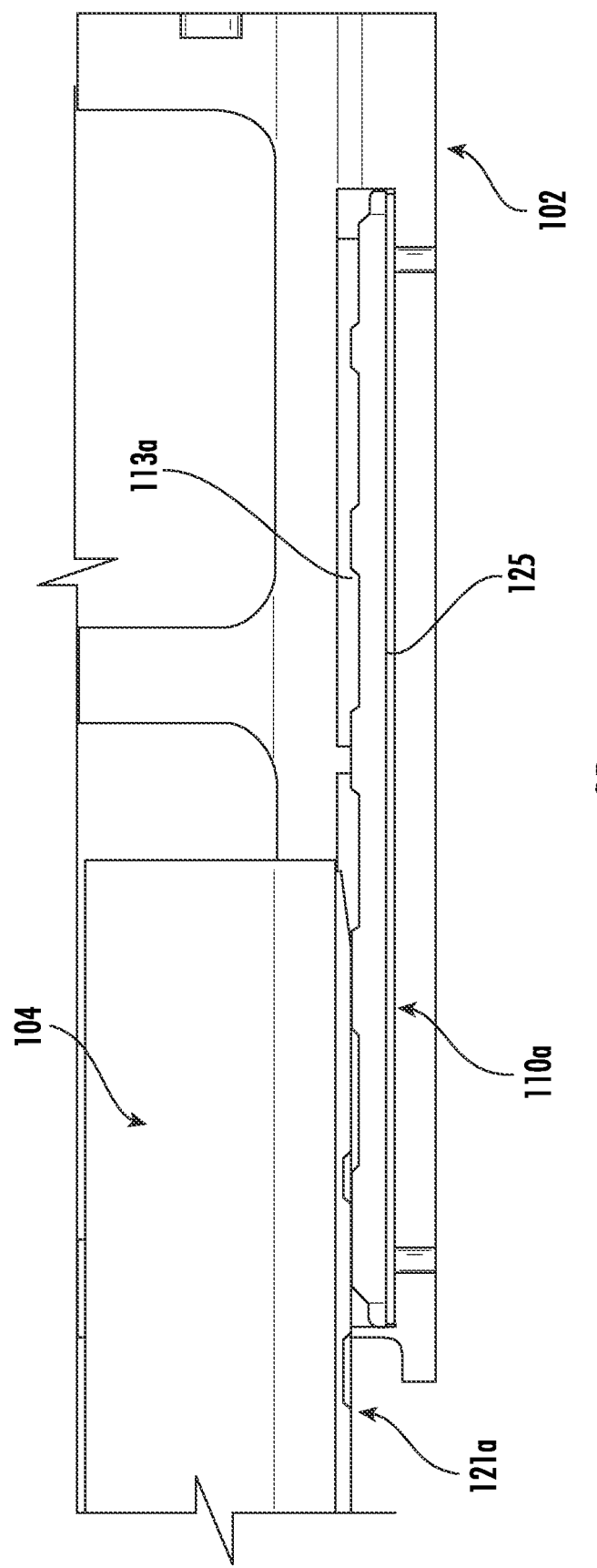
Figure 8C:
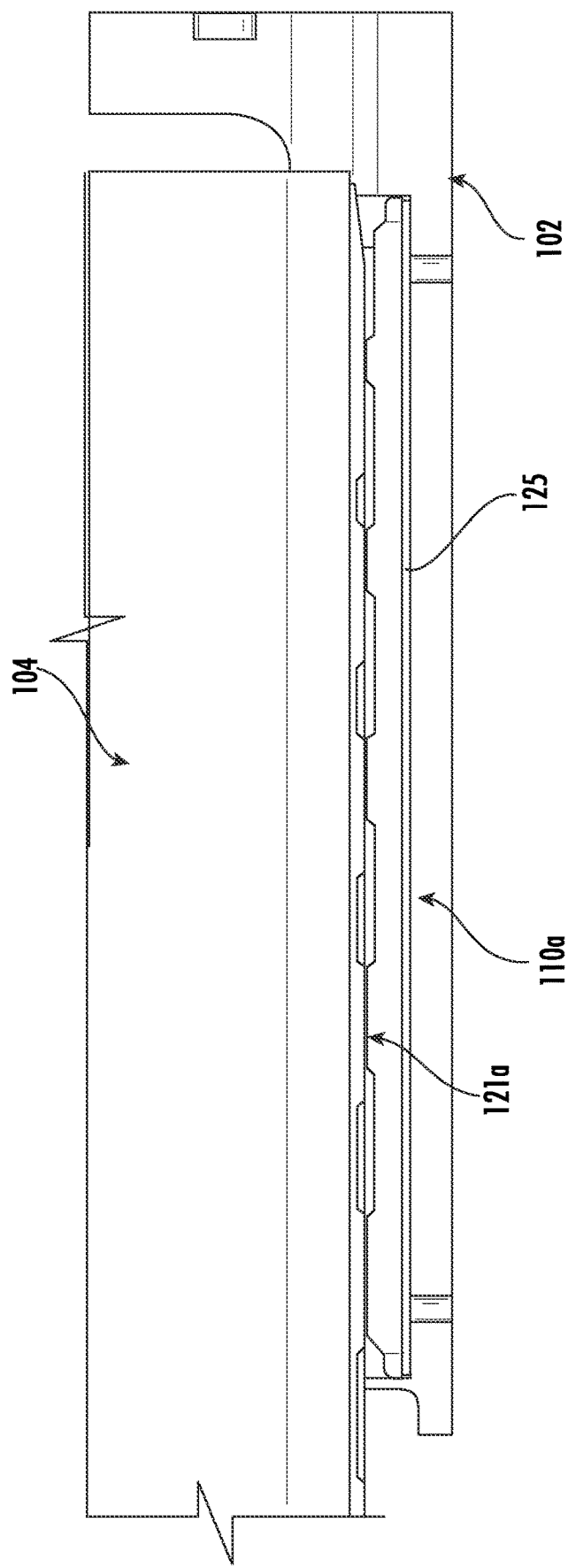

Referring now to FIGS. 7A-7C & 8A-8D, the module glide surface 107 and the retainer glide surface 113 have respective cooperating features so that the respective electronic module 104 is maintained in spaced relation from the gas sealing gasket 114 as the respective electronic module is slidably inserted into the seated position, as shown in FIGS. 7C & 8D. In the illustrated embodiment, the cooperating features comprise the plurality of protrusions 115*a*-115*f*, 116*a*-116*f* and the plurality of valleys 117*a*-117*f*, 120*a*-120*f*. As shown in FIG. 8A-8C, the sealing retainer 110*a*-110*b* springs backward into the chassis 101 while the electronic module 104 is inserted. For example, the sealing retainer 110*a*-110*b* may retract a distance in the range of 40-80 mils. Advantageously, this may reduce wear on the gas sealing gasket 114 due to the electronic module 104 not rubbing (i.e. causing shear forces) on it during insertion and removal of the electronic module.

In particular, as shown in FIGS. 7C & 8D, the plurality of valleys 117*a*-117*f*, 120*a*-120*f* is aligned with the plurality of protrusions 115*a*-115*f*, 116*a*-116*f* when the respective electronic module 104 is in the seated position. In other words, the plurality of valleys 117*a*-117*f*, 120*a*-120*f* is equally aligned onto the plurality of protrusions 115*a*-115*f*, 116*a*-116*f* so that respective protrusion fits into respective valleys, thereby positioning the gas sealing gasket 114 to be seated on and around the module cooling gas passageway 105.

Alternatively, when the respective electronic module 104 is not in the seated position (i.e. the electronic module is being inserted into the respective electronic module mounting position 102*a*-102*f* of the chassis 101), the plurality of valleys 117*a*-117*f*, 120*a*-120*f* may be offset from the plurality of protrusions 115*a*-115*f*, 116*a*-116*f*. In other words, the plurality of valleys 117a-117f, 120a-120f are laterally spaced with respect to the plurality of protrusions 115a-115f, 116a-116f so that respective protrusion engages raised portions between respective valleys, thereby positioning the gas sealing gasket 114 to be spaced apart from the module cooling gas passageway 105.

In some embodiments, the respective cooperating features of the module glide surface 107 and the retainer glide surface 113 comprises first and second keyed surfaces. The first and second keyed surfaces would engage and maintain the spaced apart relation until the electronic module 104 is in the seated position. Once in the seated position, the first and second keyed surfaces would interface and abut each other (i.e. taking the seated position). In some embodiments, the cooperating features may comprise protrusions having one or more of varying shapes, varying sizes, and varying laterally spacing therebetween so that no adjacent ones were identical, and avoiding premature seating of the retainer 110a-110b before the electronic module 104 is the seated position. The opposing side would include corresponding varying recesses. In some embodiments (FIG. 9), one or more of the plurality of protrusions 115a-115f, 116a-116f may comprise one or more roller devices.

As perhaps best seen in FIGS. 2 & 5A-5B, the electronic module 104 comprises first and second glide surface bodies 121a-121b defining a slotted opening 127 to be aligned with the cooling gas passageway 111 and the module cooling gas passageway 105. The slotted opening is illustratively rectangular in shape. The glide surface body 121a-121b also defines a plurality of fastener receiving openings 122a-122b to receive fasteners 123a-123b (e.g. threaded screws) to couple the glide surface body to the electronic module 104. The glide surface body 121a-121b has a first major surface to abut the electronic module 104, and a second major surface opposite the first major surface and defining the module glide surface 107.

In the illustrated embodiment, the glide surface body 121a-121b is modular and coupled to a housing of the electronic module 104. But in other embodiments, the glide surface body 121a-121b may be integral with a housing of the electronic module 104. As perhaps best seen in FIG. 5A, the module glide surface 107 comprises a tapered distal end 124, which helps guide the electronic module 104 during the insertion process. The glide surface body 121a-121b may comprise a polymer material having a low friction surface property.

Figure 6:
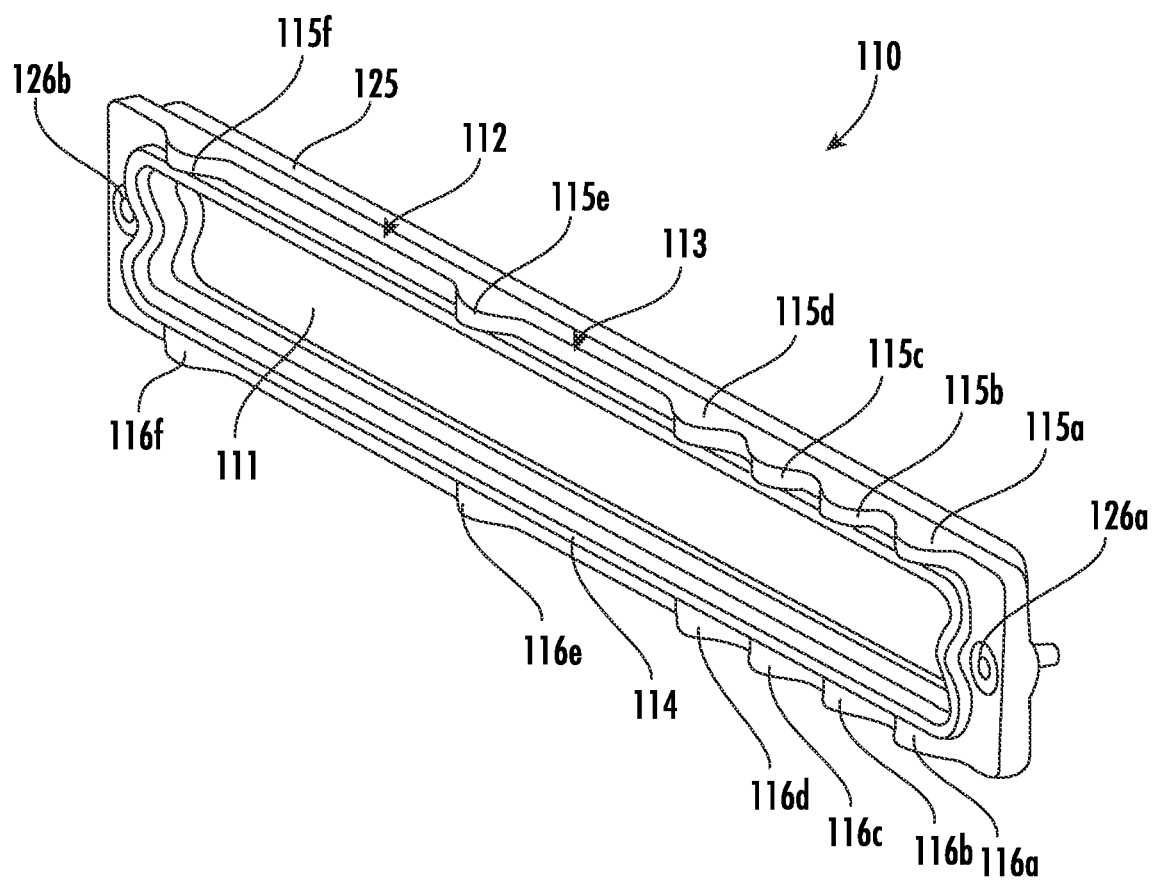
FIG. 6 is a schematic perspective view of a sealing retainer from the electronic assembly of FIG. 1.

As seen in FIG. 6, the sealing retainer 110a-110b illustratively includes a biasing member 125 coupled between the retainer body 112 and a respective electronic module mounting position 102a-102f. The biasing member 125 may comprise a flexible foam material. In these embodiments, the flexible foam material may lose needed flexibility at lower temperatures (e.g. −50° C.). In some embodiments, the biasing member 125 includes one or more biasing devices, such as one or more coil springs or a leaf spring, and the flexible foam material is overmolded over the one or more biasing devices. The sealing retainer 110a-110b comprises first and second shoulder screws 126a-126b carried by the respective electronic module mounting position 102a-102f and extending through the retainer body 112. As perhaps best seen in FIGS. 8A-8B, in cooperation with the biasing member 125 and the first and second shoulder screws 126a-126b, the sealing retainer 110a-110b is able to flexibly move as the respective cooperating features of the module glide surface 107 and the retainer glide surface 113 interact.

In the illustrated embodiment, the electronic assembly 100 includes first and second sealing retainers 110a-110b on both sides of each electronic module mounting position 102a-102f. Also, the electronic module 104 includes first and second glide surface bodies 121a-121b cooperating with the first and second sealing retainers 110a-110b. In other embodiments, these features may be limited to one side only (i.e. positive pressure cooling side).

Another aspect is directed to a method for mounting an electronic module 104 in an electronic module mounting position 102a-102f of a chassis 101, each electronic module mounting position having a chassis cooling gas passageway 103a-103f. The electronic module 104 has a module cooling gas passageway 105, and a module glide surface 107. The method comprises coupling a sealing retainer 110a-110b between the chassis 101 and the electronic module 104. The sealing retainer 110a-110b has a cooling gas passageway 111 therethrough aligned with the chassis cooling gas passageway 103a-103f and the module cooling gas passageway 105. The sealing retainer 110a-110b comprises a retainer body 112 having a retainer glide surface 113, and a gas sealing gasket 114 carried by the retainer body. The module glide surface 107 and the retainer glide surface 113 have respective cooperating features so that the respective electronic module 104 is maintained in spaced relation from the gas sealing gasket 114 as the respective electronic module is slidably inserted into a seated position.

Advantageously, the electronic assembly 100 may reduce seal shearing in VITA standards. Moreover, the approach disclosed herein may be durable and have a lifetime of up to 500 insertion cycles. Because the gas sealing gasket 114 is not subjected to seal shearing forces each insertion, the operation of the overall cooling system is not degraded. Moreover, the sealing retainer 110a-110b may be simple and less costly to produce. Indeed, in the illustrated embodiment, the sealing retainer 110a-110b comprises the retainer body 112, the gas sealing gasket 114, and the biasing member 125. Also, since the sealing retainer 110a-110b may be thin, as compared to typical approaches, the addition to the electronic assembly 100 is helpful for SWaP purposes.

Figure 9:
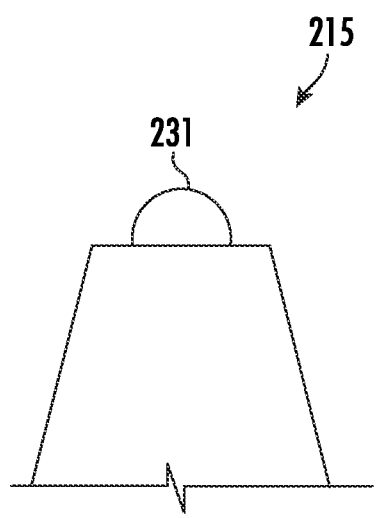
FIG. 9 is a schematic side view of protrusions in the retainer glide surface, according to another embodiment of the present disclosure.

Referring now additionally to FIG. 9, another embodiment of the protrusion 215 is now described. In this embodiment of the protrusion 215, those elements already discussed above with respect to FIGS. 1-8D are incremented by 100 and most require no further discussion herein. This embodiment differs from the previous embodiment in that this protrusion 215 illustratively includes a roller device 231 (e.g. ball bearing) on an uppermost portion thereof.

Other features relating to electronic assemblies are disclosed in co-pending applications: titled "ELECTRONIC ASSEMBLY HAVING SEALING RETAINER COUPLING AN ELECTRONIC MODULE AND ASSOCIATED METHOD," application Ser. No. 17/660,842; and titled "SEALING RETAINER TO BE COUPLED BETWEEN CHASSIS AND ELECTRONIC MODULE AND ASSOCIATED METHOD," application Ser. No. 17/660,838, all incorporated herein by reference in their entirety.

Many modifications and other embodiments of the present disclosure will come to the mind of one skilled in the art having the benefit of the teachings presented in the foregoing descriptions and the associated drawings. Therefore, it is understood that the present disclosure is not to be limited to the specific embodiments disclosed, and that modifications and embodiments are intended to be included within the scope of the appended claims.

The invention claimed is:

1. An electronic assembly comprising:
a chassis having a plurality of electronic module mounting positions, each electronic module mounting position having a chassis cooling gas passageway;
a respective electronic module received in each electronic module mounting position and having a module cooling gas passageway, each electronic module having a module glide surface; and
a respective sealing retainer coupled between the chassis and each electronic module, the sealing retainer having a cooling gas passageway therethrough aligned with the chassis cooling gas passageway and the module cooling gas passageway, the sealing retainer comprising
a retainer body having a retainer glide surface, and
a gas sealing gasket carried by the retainer body;
the module glide surface and the retainer glide surface having respective cooperating features so that the respective electronic module is maintained in spaced relation from the sealing gasket as the respective electronic module is slidably inserted into a seated position;
the cooperating features comprising one of the module glide surface and the retainer glide surface comprising a plurality of protrusions, and the other of the module glide surface and the retainer glide surface comprising a plurality of valleys so that the plurality of valleys is aligned with the plurality of protrusions when the respective electronic module is in the seated position.

2. The electronic assembly of claim 1 wherein the plurality of valleys is offset from the plurality of protrusions when the respective electronic module is not in the seated position.

3. The electronic assembly of claim 1 wherein each of the plurality of protrusions comprises a roller device on an uppermost portion thereof.

4. The electronic assembly of claim 1 wherein the module glide surface comprises a tapered distal end.

5. The electronic assembly of claim 1 wherein the sealing retainer comprises a biasing member coupled between the retainer body and a respective electronic module mounting position.

6. The electronic assembly of claim 5 wherein the sealing retainer comprises a shoulder screw carried by the respective electronic module mounting position and extending through the retainer body.

7. The electronic assembly of claim 1 wherein the chassis cooling gas passageway comprises one of a chassis cooling gas inlet passageway and a chassis cooling gas outlet passageway.

8. The electronic assembly of claim 1 comprising at least one cooling gas manifold coupled to the chassis.

9. The electronic assembly of claim 1 wherein each electronic module comprises at least one circuit board having a cooling gas path associated therewith.

10. The electronic assembly of claim 1 wherein each electronic module comprises a plurality of wedge lock style retainers adjacent the module glide surface.

11. The electronic assembly of claim 1 wherein each electronic module comprises a plurality of extraction levers for coupling to the electronic module mounting position.

12. An electronic assembly comprising:
a chassis having a plurality of electronic module mounting positions, each electronic module mounting position having a chassis cooling gas passageway;
a respective electronic module received in each electronic module mounting position and having a module cooling gas passageway, each electronic module having a module glide surface with a tapered distal end; and
a respective sealing retainer coupled between the chassis and each electronic module, the sealing retainer having a cooling gas passageway therethrough aligned with the chassis cooling gas passageway and the module cooling gas passageway, the sealing retainer comprising
a retainer body having a retainer glide surface,
a gas sealing gasket carried by the retainer body, and
a biasing member coupled between the retainer body and a respective electronic module mounting position;
the module glide surface and the retainer glide surface having respective cooperating features so that the respective electronic module is maintained in spaced relation from the sealing gasket as the respective electronic module is slidably inserted into a seated position;
the cooperating features comprising one of the module glide surface and the retainer glide surface comprising a plurality of protrusions, and the other of the module glide surface and the retainer glide surface comprising a plurality of valleys so that the plurality of valleys is aligned with the plurality of protrusions when the respective electronic module is in the seated position.

13. The electronic assembly of claim 12 wherein the plurality of valleys is offset from the plurality of protrusions when the respective electronic module is not in the seated position.

14. The electronic assembly of claim 12 wherein each of the plurality of protrusions comprises a roller device on an uppermost portion thereof.

15. The electronic assembly of claim 12 wherein the sealing retainer comprises a shoulder screw carried by the respective electronic module mounting position and extending through the retainer body.

16. The electronic assembly of claim 12 wherein the chassis cooling gas passageway comprises one of a chassis cooling gas inlet passageway and a chassis cooling gas outlet passageway.

17. The electronic assembly of claim 12 comprising at least one cooling gas manifold coupled to the chassis.

18. The electronic assembly of claim 12 wherein each electronic module comprises at least one circuit board having a cooling gas path associated therewith.

19. A method for mounting an electronic module in an electronic module mounting position of a chassis, each electronic module mounting position having a chassis cooling gas passageway, the electronic module having a module cooling gas passageway, and a module glide surface, the method comprising:
coupling a sealing retainer between the chassis and the electronic module, the sealing retainer having a cooling gas passageway therethrough aligned with the chassis cooling gas passageway and the module cooling gas passageway, the sealing retainer comprising
a retainer body having a retainer glide surface, and
a gas sealing gasket carried by the retainer body;
the module glide surface and the retainer glide surface having respective cooperating features so that the respective electronic module is maintained in spaced relation from the sealing gasket as the respective electronic module is slidably inserted into a seated position;
the cooperating features comprising one of the module glide surface and the retainer glide surface comprising a plurality of protrusions, and the other of the module glide surface and the retainer glide surface comprising a plurality of valleys so that the plurality of valleys is aligned with the plurality of protrusions when the respective electronic module is in the seated position.

20. The method of claim 19 wherein the plurality of valleys is offset from the plurality of protrusions when the respective electronic module is not in the seated position.

21. The method of claim 19 wherein the module glide surface comprises a tapered distal end.

* * * * *